(12) United States Patent
Ikemoto

(10) Patent No.: US 7,078,371 B2
(45) Date of Patent: Jul. 18, 2006

(54) CLEANING COMPOSITION

(75) Inventor: Kazuto Ikemoto, Tokyo (JP)

(73) Assignee: Mitsubishi Gas Chemical Company, Inc., Tokyo (JP)

( * ) Notice: Subject to any disclaimer, the term of this patent is extended or adjusted under 35 U.S.C. 154(b) by 6 days.

(21) Appl. No.: 10/654,997

(22) Filed: Sep. 5, 2003

(65) Prior Publication Data

US 2004/0048761 A1    Mar. 11, 2004

(30) Foreign Application Priority Data

Sep. 9, 2002    (JP)    ............... 2002-263342

(51) Int. Cl.
*C11D 7/32*    (2006.01)
*C11D 7/50*    (2006.01)

(52) U.S. Cl. ............... 510/176; 510/245; 510/255; 510/258; 510/264; 510/499; 510/502; 510/259; 510/504

(58) Field of Classification Search ........ 510/175, 510/176, 245, 255, 258, 264, 499; 438/692
See application file for complete search history.

(56) References Cited

U.S. PATENT DOCUMENTS

| 6,037,472 | A | * | 3/2000 | Castelhano et al. | ...... 546/269.7 |
| 6,398,874 | B1 | * | 6/2002 | Park et al. | ...................... 134/2 |
| 2002/0177316 | A1 | * | 11/2002 | Miller et al. | ................ 438/689 |
| 2003/0078174 | A1 | * | 4/2003 | Park et al. | .................. 510/176 |
| 2004/0152309 | A1 | * | 8/2004 | Carter et al. | ................ 438/689 |

FOREIGN PATENT DOCUMENTS

WO    WO99/23667    *    5/1999

* cited by examiner

*Primary Examiner*—Gregory R. Del Cotto
(74) *Attorney, Agent, or Firm*—Antonelli, Terry, Stout and Kraus, LLP.

(57) ABSTRACT

The cleaning composition of the present invention is characterized by containing N-hydroxyformamide. The cleaning composition is capable of easily removing patterned photoresist masks or resist residues remaining on substrates after the etching process or removing resist residues remaining after the etching process and the subsequent ashing process within a short period of time without causing the corrosion of wiring materials and insulating films, thereby ensuring the fine processing to provide high-precision wiring circuits.

14 Claims, No Drawings

CLEANING COMPOSITION

BACKGROUND OF THE INVENTION

1. Field of the Invention

Photoresists have been widely used in the lithographic production of integrated circuits such as IC and LSI, display devices such as LCD and EL devices, printed boards, micromachines, DNA chips, microplants, etc. The present invention basically relates to a cleaning composition for removing photoresists from various surfaces such as surfaces of substrate. The present invention further relates to a method of removing etching residues formed in the lithographic production and impurities remaining on the surface of substrate.

2. Description of the Prior Art

Alkaline cleaning compositions, such as a composition comprising an alkanol amine and an organic solvent and a composition comprising a quaternary ammonium hydroxide and an organic solvent, have been conventionally used to remove photoresists (U.S. Pat. Nos. 4,276,186, 4,770,713, 4,403,029 and 3,673,099). However, these compositions containing alkaline compounds to be used in the photoresist stripping process are generally less efficient for use in the recent production of semiconductor devices and liquid crystal display panels which requires fine processing and short-term treatment. Therefore, the need continues for more efficient compositions.

Unlike the removal of organic substances such as resists, the known compositions are less effective for removing resist residues, which are probably made of inorganic substances, such as sidewall polymers formed on substrates through a dry etching process and a subsequent ashing process. Alternatively, the known compositions are unfavorably corrosive to the materials on substrates.

To remove such drawbacks, compositions containing hydroxylamine have been proposed in Japanese Patent Application Laid-Open Nos. 4-289866, 6-266119 and 9-296200. Hydroxylamine is effective for removing resists, and also quite effective for removing resist residues formed by the ashing process after the etching process. However, hydroxylamine is easily decomposed. In addition, since hydroxylamine is available as aqueous solutions, the formulating latitude is narrow. Further, the proposed compositions cause corrosion, particularly, if materials containing titanium are used.

Japanese Patent Application Laid-Open Nos. 4-289866, 6-266119 and 9-296200 teach that hydroxylamine derivatives such as acyl-substituted and alkyl-substituted hydroxylamines are also effective. However, the inventor has experimentally found that the proposed derivatives are extremely poor in the capability of removing resist residues as compared with non-substituted hydroxylamine.

SUMMARY OF THE INVENTION

An object of the present invention is to provide a cleaning composition and a cleaning method which are capable of easily removing patterned photoresist masks or resist residues remaining on substrates after the etching process or removing resist residues remaining after the etching process and the subsequent ashing process within a short period of time without causing the corrosion of wiring materials and insulating films, thereby ensuring the fine processing to provide high-precision wiring circuits.

As a result of extensive study in view of achieving the above object, the inventor has found that a cleaning composition containing N-hydroxyformamide removes resist residues, etc. easily within a short period of time without causing the corrosion of wiring materials and insulating films, thereby ensuring the fine processing to provide high-precision wiring circuits.

Thus, the present invention provides a cleaning composition containing N-hydroxyformamide.

The present invention further provides a method for cleaning substrates of semiconductor integrated circuits or liquid crystal display devices by bringing the substrates into contact with the cleaning composition after etching or ashing.

DETAILED DESCRIPTION OF THE INVENTION

The cleaning composition of the present invention for cleaning substrates contains N-hydroxyformamide represented by the following formula (2):

in an amount of 0.001 to 95% by weight, preferably 0.001 to 60% by weight.

The inventor has tested hydroxamic acids and substituted hydroxylamines that have similar structures to N-hydroxyformamide, but failed to find out any compounds effective for removing resist residues. Thus, only N-hydroxyformamide was found to be effective for the purpose.

The resist stripping capability of the cleaning composition of the present invention can be enhanced by the use of N-hydroxyformamide in combination with an alkaline compound. Since the cleaning composition is to be used in the production of semiconductors, etc., it is preferred for the alkaline compound to include no metallic element. The alkaline compound may include ammonia, alkylamines, alkanolamines, polyamines, hydroxylamine compounds, cyclic amines, quaternary ammonium salts.

Examples of the alkylamines include primary alkylamines such as methylamine, ethylamine, n-propylamine, isopropylamine, n-butylamine, sec-butylamine, isobutylamine, t-butylamine, pentylamine, 2-aminopentane, 3-aminopentane, 1-amino-2-methylbutane, 2-amino-2-methylbutane, 3-amino-2-methylbutane, 4-amino-2-methylbutane, hexylamine, 5-amino-2-methylpentane, heptylamine, octylamine, nonylamine, decylamine, undecylamine, dodecylamine, tridecylamine, tetradecylamine, pentadecylamine, hexadecylamine, heptadecylamine, and octadecylamine; secondary alkylamines such as dimethylamine, diethylamine, dipropylamine, diisopropylamine, dibutylamine, diisobutylamine, di-sec-butylamine, di-t-butylamine, dipentylamine, dihexylamine, diheptylamine, dioctylamine, dinonylamine, didecylamine, methylethylamine, methylpropylamine, methylisopropylamine, methylbutylamine, methylisobutylamine, methyl-sec-butylamine, methyl-t-butylamine, methylamylamine, methylisoamylamine, ethylpropylamine, ethylisopropylamine, ethylbutylamine, ethylisobutylamine, ethyl-sec-butylamine, ethylamine, ethylisoamylamine, propylbutylamine, and propylisobutylamine; and tertiary alkylamines such as trimethylamine, triethylamine, tripropylamine, tributylamine, tripentylamine, dimethylethylamine, methyldiethylamine, and methyldipropylamine.

Examples of the alkanolamines include ethanolamine, N-methylethanolamine, N-ethylethanolamine, N-propylethanolamine, N-butylethanolamine, diethanolamine, isopropanolamine, N-methylisopropanolamine, N-ethylisopropanolamine, N-propylisopropanolamine, 2-aminopropane-1-ol, N-methyl-2-amino-propane-1-ol, N-ethyl-2-aminopropane-1-ol, 1-aminopropane-3-ol, N-methyl-1-aminopropane-3-ol, N-ethyl-1-aminopropane-3-ol, 1-aminobutane-2-ol, N-methyl-1-aminobutane-2-ol, N-ethyl-1-aminobutane-2-ol, 2-aminobutane-1-ol, N-methyl-2-aminobutane-1-ol, N-ethyl-2-aminobutane-1-ol, 3-aminobutane-1-ol, N-methyl-3-aminobutane-1-ol, N-ethyl-3-aminobutane-1-ol, 1-aminobutane-4-ol, N-methyl-1-aminobutane-4-ol, N-ethyl-1-aminobutane-4-ol, 1-amino-2-methylpropane-2-ol, 2-amino-2-methylpropane-1-ol, 1-aminopentane-4-ol, 2-amino-4-methylpentane-1-ol, 2-aminohexane-1-ol, 3-aminoheptane-4-ol, 1-aminooctane-2-ol, 5-1-aminooctane-4-ol, 1-aminopropane-2,3-diol, 2-aminopropane-1,3-diol, tris(oxymethyl)aminomethane, 1,2-diaminopropane-3-ol, 1,3-diaminopropane-2-ol, and 2-(2-aminoethoxyl)ethanol.

Examples of the polyamines include ethylenediamine, propylenediamine, trimethylenediamine, tetramethylenediamine, 1,3-diaminobutane, 2,3-diaminobutane, pentamethylenediamine, 2,4-diaminopentane, hexamethylenediamine, heptamethylenediamine, octamethylenediamine, nonamethylenediamine, N-methylethylenediamine, N,N-dimethylethylenediamine, trimethylethylenediamine, N-ethylethylenediamine, N,N-diethylethylenediamine, triethylethylenediamine, 1,2,3-triaminopropane, hydrazine, tris(2-aminoethyl)amine, tetra(aminomethyl)methane, diethylenetriamine, triethylenetetramine, tetraethylpentamine, heptaethyleneoctamine, nonaethylenedecamine, and diazabicycloundecene.

Examples of the hydroxylamine compounds include hydroxylamine, N-methylhydroxylamine, N-ethylhydroxylamine, N,N-diethylhydroxylamine, and O-methylhydroxylamine.

Examples of the cyclic amines include pyrrole, 2-methylpyrrole, 3-methylpyrrole, 2-ethylpyrrole, 3-ethylpyrrole, 2,3-dimethylpyrrole, 2,4dimethylpyrrole, 3,4-dimethylpyrrole, 2,3,4-trimethylpyrrole, 2,3,5-trimethylpyrrole, 2-pyrroline, 3-pyrroline, pyrrolidine, 2-methylpyrrolidine, 3-methylpyrrolidine, pyrazole, imidazole, 1,2,3-triazole, 1,2,3,4-tetrazole, piperidine, 2-pipecoline, 3-pipecoline, 4-pipecoline, 2,4-lupetidine, 2,6-lupetidine, 3,5-lupetidine, piperazine, 2-methylpiperazine, 2,5-dimethylpiperazine, 2,6-methylpiperazine, and morpholine.

Examples of the quaternary ammonium salts include tetramethylammonium hydroxide, tetraethylammonium hydroxide, tetrapropylammonium hydroxide, tetrabutylammonium hydroxide, choline hydroxide, and acetylcholine hydroxide.

The amines are not specifically limited to those mentioned above, and other amines may be used as long as they are of alkaline nature.

Of the above amines, preferred are methylamine, ethylamine, propylamine, butylamine, ethanolamine, N-methylethanolamine, N-ethylethanolamine, diethanolamine, isopropanolamine, 2-(2-aminoethoxyl)ethanol, ethylenediamine, propylenediamine, butylenediamine, diethylenetriamine, piperazine, and morpholine.

The alkaline compounds listed above may be use alone or in combination of two or more.

The content of the alkaline compound in the cleaning composition is preferably 0 to 99.999% by weight, more preferably 0.01 to 80% by weight.

The organic solvent usable in the present invention is not specifically limited as long as it is miscible with N-hydroxyformamide, and preferably a water-soluble organic solvent. Examples thereof include ether solvents such as ethylene glycol, ethylene glycol monoethyl ether, ethylene glycol monobutyl ether, diethylene glycol monomethyl ether, diethylene glycol monoethyl ether, diethylene glycol monobutyl ether, propylene glycol monomethyl ether, propylene glycol monoethyl ether, propylene glycol monobutyl ether, dipropylene glycol monomethyl ether, dipropylene glycol monoethyl ether, dipropylene glycol monobutyl ether, diethylene glycol dimethyl ether, and dipropylene glycol dimethyl ether; amide solvents such as formamide, monomethylformamide, dimethylformamide, monoethylformamide, diethylformamide, acetamide, monomethylacetamide, dimethylacetamide, monoethylacetamide, diethylacetamide, N-methylpyrrolidone, and N-ethylpyrrolidone; alcohol solvents such as methyl alcohol, ethyl alcohol, isopropanol, ethylene glycol, and propylene glycol; sulfoxide solvents such as dimethyl sulfoxide; sulfone solvents such as dimethyl sulfone, diethyl sulfone, bis(2-hydroxyethyl) sulfone, and tetramethylene sulfone; imidazolidinone solvents such as 1,3-dimethyl-2-imidazolidinone, 1,3-diethyl-2-imidazolidinone, and 1,3-diisopropyl-2-imidazolidinone; and lactone solvents such as γ-butylolactone and δ-valerolactone.

Of the above solvents, preferred are dimethyl sulfoxide, N,N-dimethyl formamide, N,N-dimethylacetamide, N-methylpyrrolidone, diethylene glycol monomethyl ether, diethylene glycol monobutyl ether, dipropylene glycol monomethyl ether, dipropylene glycol monobutyl ether, and propylene glycol, because of their easy availability and easiness of handling due to high boiling points. The content of the organic solvent is not specifically limited, and preferably 0 to 95% by weight, more preferably 20 to 80% by weight of the cleaning composition.

The cleaning composition of the present invention may contain water preferably in an amount up to 60% by weight, more preferably 3 to 40% by weight of the cleaning composition, although not particularly limited thereto.

The cleaning composition of the present invention may further contain a corrosion inhibitor such as aromatic hydroxy compounds, sugar alcohols, triazole compounds and chelating compounds preferably in an amount of 0.01 to 25% by weight of the cleaning composition.

Examples of the aromatic hydroxy compounds include phenol, cresol, xylenol, pyrocatechol, t-butylcatechol, resorcinol, hydroquinone, pyrogallol, 1,2,4-benzenetriol, salicyl alcohol, p-hydroxybenzyl alcohol, o-hydroxybenzyl alcohol, p-hydroxyphenethyl alcohol, p-aminophenol, m-aminophenol, diaminophenol, aminoresorcinol, p-hydroxybenzoic acid, o-hydroxybenzoic acid, 2,4-dihydroxybenzoic acid, 2,5-dihydroxybenzoic acid, 3,4-dihydroxybenzoic acid, 3,5-dihydroxybenzoic acid, and gallic acid. Examples of the sugar alcohols include sorbitol, xylitol, and palatinit. Examples of the triazole compounds include benzotriazole, aminotriazole, and aminotetrazole. Examples of the chelating compounds include phosphoric acid compounds such as 1,2-propanediaminetetramethylenephosphonic acid and hydroxyethanephosphonic acid; carboxylic acid compounds such as ethylenediaminetetraacetic acid, dihydroxyethylglycine, nitrilotriacetic acid, oxalic acid, citric acid, malic acid, and tartaric acid; amine compounds such as bipyridine, tetraphenylporphyrin, phenanthroline, and 2,3-pyridinediol; oxime compounds such as dimethylglyoxime and diphenylglyoxime; and acetylene compounds such as phenylacetylene and 2,5-dimethyl-3-hexyne-2,5-diol. These compounds may be used alone or in combination of two or more.

The cleaning composition may further contain an amine polymer having an average molecular weight of 250 or more. The amine polymer is very effective for preventing the corrosion of silicon, aluminum, aluminum alloy, copper, copper alloy and tungsten, and provides a non-corrosive composition when used in combination with N-hydroxyformamide (formhydroxamic acid). Such a composition is extremely effective for preventing the corrosion of silicon, and very effective for preventing the corrosion of copper. The amine polymer may contain nitrogen atoms in either of side chains or backbone chains. The upper limit of the molecular weight is not strictly limited, but an excessively large molecular weight makes the amine polymer less miscible with other components of the cleaning composition. Therefore, the upper limit of the molecular weight is preferably 100,000. The amine polymer may be in the free form or the salt form, and may be suitably selected depending on the purpose. Preferred are the free form and the organic acid salt form.

Examples of the amine polymer include polyethyleneimine, polyvinylamine, polyallylamine, polyornithine, polylysine, polyallylbiguanididoallylamine, polyallyl-N-carbamoylguanidinoallylamine, polyallylamine copolymer, polydiallylamine, and polydiallylamine copolymer. In the present invention, the amine polymer is not specifically limited those mentioned above. The amine polymers may be used alone or incombination of two or more preferably in an amount of 0.0001 to 30% by weight of the cleaning composition.

Preferred are polyethyleneimine, polyvinylamine, and polyallylamine because of their easy availability and easiness of handling. The structural formulas of these polymers are schematically shown below.

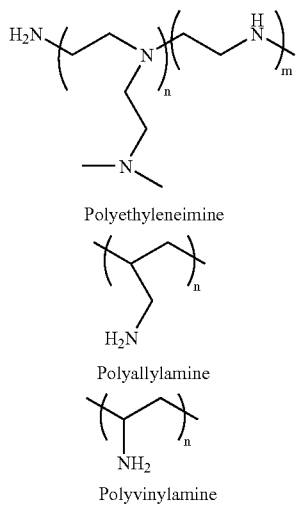

Polyethyleneimine

Polyallylamine

Polyvinylamine

In the present invention, the amine polymer is not particularly limited to those mentioned above and suitably selected from polymers having amino groups. The amino groups may be of primary, secondary, tertiary and quaternary groups, and two or more thereof may be combinedly included in the polymer.

The cleaning composition of the present invention may further contain a hydroxymethylamino compound represented by the following formula (1). The hydroxymethylamino compound enhances the stripping capability to organic resists. Therefore, by the use of the hydroxymethylamino compound in combination with N-hydroxyformamide, resists and resist residues are both effectively removed.

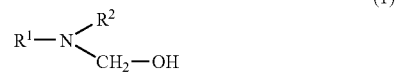

(1)

wherein $R^1$ and $R^2$ are each independently hydrogen or substituent having 1 to 12 carbon atoms, $R^1$ and $R^2$ optionally being bonded to each other to form together with nitrogen a ring structure having 2 to 12 carbon atoms.

In the preferred compound of the formula (1), one of $R^1$ and $R^2$ is hydrogen or methyl, and the other is alkyl group, hydroxyl-containing alkyl group, amino-containing alkyl group, ether-containing alkyl group, acyl group, or carbonyl-containing group. Alternatively, each of $R^1$ and $R^2$ is independently alkyl group, hydroxyl-containing alkyl group, amino-containing alkyl group, ether-containing alkyl group, acyl group, or carbonyl-containing group. Examples of the compounds of the formula (1) include N-hydroxymethylethanolamine, N-hydroxymethylisopropanolamine, N,N-dihydroxymethylethanolamine, N-hydroxymethyldiethanolamine, N-hydroxymethyl-N-methylethanolamine, N-hydroxymethyl-N-ethylethanolamine, N-hydroxymethylaminoethoxyethanol, N-hydroxymethylethylenediamine, N,N'-dihydroxymethylethylenediamine, N,N-dihydroxymethylethylenediamine, N,N,N'-trihydroxymethylethylenediamine, N,N,N',N'-tetrahydroxymethylethylenediamine, N-hydroxymethylbutylenediamine, N-hydroxymethylpropylenediamine, N-hydroxymethyldiethylenetriamine, N,N"-dihydroxymethyldiethylenetriamine, N-hydroxymethylmethylamine, N,N-dihydroxymethylmethylamine, N-hydroxymethyldimethylamine, N-hydroxymethylethylamine, N,N-dihydroxymethylethylamine, N-hydroxymethyldiethylamine, N-hydroxymethylpropylamine, N-hydroxymethylbutylamine, N-hydroxymethylformamide, N-hydroxymethylacetamide, N-hydroxymethylpyrrolidone, N-hydroxymethyl-N-methylformamide, N-hydroxymethyl-N-methylacetamide, N-hydroxymethylpropionamide, N-hydroxymethylurea, N,N'-dihydroxymethylurea, N-hydroxymethylacrylamide, N-hydroxymethylglycine, N-hydroxymethylguanidine, and N,N'-dihydroxymethylguanidine. The compounds of the formula (1) are not limited to those mentioned above, and any compounds having the aminohydroxymethyl structure may be used.

The reason for the efficient resist-removing ability of N-hydroxyformamide is not elucidated, but it can be considered that, after the dry etching process, N-hydroxyformamide strongly bonds to metal ions adhered to the resist surface or the altered resist layer by the chelating action or the addition reaction to increase the solubility of remaining resists or resist residues. The formation of chelate complex by N-hydroxyfromamide can be inferred from the ability of hydroxamic acid to form coordinate compounds with transition metals as described in Kagaku Daijiten, Tokyo Kagaku Dojin, Tokyo, Japan, 1989. The alkaline compound, if combinedly used, makes resists easily decomposable or soluble to increase the resist stripping capability.

Using the cleaning composition of the present invention, the resist removal in the production of semiconductor devices is performed preferably at room temperature to 150° C. To prevent the attack to the materials of substrate, the resist removal is preferably performed at temperatures as low as possible, for example, at 70° C. or lower.

The substrate to be treated in the present invention may be made of various materials such as silicon, amorphous silicon, polysilicon and glass. The substrate may have thin films made of semiconductor wiring materials such as silicon oxide, silicon nitride, copper, copper alloy, aluminum, aluminum alloy, gold, platinum, silver, titanium, titanium-tungsten, titanium nitride, tungsten, tantalum, tantalum compound, chromium, chromium oxide, chromium alloy and indium-tin-oxide (ITO); compound semiconductors such as gallium-arsenic, gallium-phosphorus and indium-phosphorus; and dielectric materials such as strontium-bismuth-tantalum.

Using the cleaning composition of the present invention, semiconductor devices are produced, for example, in the following manner. A resist composition is applied on an electroconductive thin film to form a resist layer, which is then patterned. Using the patterned resist as the mask, the non-masked region of the underlying electroconductive thin film is etched. Thereafter, the substrate is brought into contact with the cleaning composition to remove the remaining resist residues. If desired, the substrate may be subjected to ashing treatment after the etching process, and then, the resist residues are removed by the cleaning composition. After the treatment with the cleaning composition of the present invention, the substrate may be rinsed with a rinsing liquid, for example, an organic solvent such as alcohol or water although not limited thereto.

The present invention will be explained in more detail by reference to the following examples which should not be construed to limit the scope of the present invention.

EXAMPLES 1–6 AND COMPARATIVE EXAMPLES 1–3

On a wafer, a $SiO_2$/Ti/TiN/Al—Cu/TiN laminate structure was formed in this order. A resist composition was applied on the TiN layer and patterned. Using the patterned resist as the mask, via structures were formed by dry etching, followed by ashing. The via structures reached the TiN layer. On the sidewall of the via structures, resist residues were remained.

The substrate thus treated was immersed in each cleaning composition shown in Table 1 at 70° C. for 30 min. After rinsed with water and dried by blowing nitrogen gas, the substrate was observed under a scanning electron microscope (SEM) to evaluate the resist removal according to the following ratings.

A: Completely removed.
B: Slightly remained.
C: Not removed.
D: Corroded.

The results are shown in Table 1.

TABLE 1

| | Compositions | | SEM Evaluation |
|---|---|---|---|
| Examples | | | |
| 1 | N-hydroxyformamide | 15 wt % | A |
| | ethanolamine | 70 wt % | |
| | water | 15 wt % | |

TABLE 1-continued

| | Compositions | | SEM Evaluation |
|---|---|---|---|
| 2 | N-hydroxyformamide | 5 wt % | A |
| | N-methylethanolamine | 35 wt % | |
| | N-methylpyrrolidone | 50 wt % | |
| | sorbitol | 1 wt % | |
| | water | 9 wt % | |
| 3 | N-hydroxyformamide | 5 wt % | A |
| | diethanolamine | 40 wt % | |
| | dimethylacetamide | 19.99 wt % | |
| | polyethyleneimine (MW = 1500) | 0.01 wt % | |
| | water | 35 wt % | |
| 4 | N-hydroxyformamide | 15 wt % | A |
| | isopropanolamine | 30 wt % | |
| | diethylene glycol monomethyl ether | 35 wt % | |
| | water | 20 wt % | |
| 5 | N-hydroxyformamide | 15 wt % | B |
| | N-methylethanolamine | 85 wt % | |
| 6 | N-hydroxyformamide | 15 wt % | A |
| | tetramethylammonium hydroxide | 2 wt % | |
| | diethylene glycol | 75 wt % | |
| | water | 8 wt % | |
| Comparative Examples | | | |
| 1 | N-hydroxylacetamide | 15 wt % | C |
| | ethanolamine | 70 wt % | |
| | water | 15 wt % | |
| 2 | N,N-diethylhydroxylamine | 15 wt % | C |
| | ethanolamine | 70 wt % | |
| | water | 15 wt % | |
| 3 | hydroxylamine | 15 wt % | D |
| | ethanolamine | 69 wt % | |
| | catechol | 1 wt % | |
| | water | 15 wt % | |

EXAMPLE 7

On a silicon substrate, an oxide film, a barrier metal film, an Al alloy (Al—Cu) film and a barrier metal film were formed in this order. Using a patterned resist as the mask, Al alloy wiring was formed by dry etching. The substrate was subjected to ashing treatment in oxygen plasma to prepare a semiconductor device. Ear-shaped residues remained on the sidewall of the wiring and streaky residues remained on the top surface of the wiring.

The semiconductor substrate was immersed at 70° C. for 30 min in a cleaning composition comprising 30% by weight of ethanolamine, 5% by weight of N-hydroxyformamide, 45% by weight of N-methylpyrrolidone, 19.999% by weight of water and 0.001% by weight of polyallylamine (molecular weight: 2000). After successively rinsed with isopropanol and super pure water and dried, the substrate was observed under a scanning electron microscope (SEM).

The resist residues were completely removed and no corrosion was found on the wiring.

COMPARATIVE EXAMPLE 4

The procedure of Example 7 was repeated except for using a composition comprising 30% by weight of ethanolamine, 50% by weight of N-methylpyrrolidone and 20% by weight of water. The resist residues partly remained unremoved, and the Al alloy was corroded. In addition, the corrosion was observed on the silicon back surface.

EXAMPLES 8–10

The procedure of Example 7 was repeated except for using each composition shown in Table 2.

TABLE 2

| Examples | Compositions | |
|---|---|---|
| 8 | N-hydroxyformamide | 3 wt % |
|   | ethanolamine | 68.95 wt % |
|   | catechol | 1 wt % |
|   | diethylene glycol monomethyl ether | 12 wt % |
|   | water | 15 wt % |
|   | polyethyleneimine (MW = 10000) | 0.05 wt % |
| 9 | N-hydroxyformamide | 5 wt % |
|   | isopropanolamine | 35 wt % |
|   | N-methylpyrrolidone | 50 wt % |
|   | sorbitol | 1 wt % |
|   | water | 9 wt % |
| 10 | N-hydroxyformamide | 5 wt % |
|   | diethanolamine | 40 wt % |
|   | dimethyloxazolidinone | 19.99 wt % |
|   | polyethyleneimine (MW = 1500) | 0.01 wt % |
|   | water | 35 wt % |

In all the examples, the resist residues were completely removed and no corrosion was found on the wiring and the silicon back surface.

EXAMPLES 11–16 AND COMPARATIVE EXAMPLES 5–6

The process for producing liquid crystal panel was simulated by wet-etching ITO on a glass substrate using a resist mask to form an ITO transparent electrode, on which resists remained. On the substrate, residues formed during the ITO etching also remained.

The substrate was immersed at 40° C. for 5 min in each cleaning composition shown in Table 3, rinsed with super pure water, and dried. Then, the surface conditions thereof were observed under an optical microscope and a scanning electron microscope (SEM) to evaluate the resist removal according to the following ratings.

A: Completely removed.
B: Substantially completely remove.
C: Partly remained unremoved.
D: Substantial part remained unremoved.

The results are shown in Table 3.

TABLE 3

| | Compositions | | Evaluation |
|---|---|---|---|
| Examples | | | |
| 11 | N-hydroxyformamide | 5 wt % | A |
|   | ethanolamine | 35 wt % | |
|   | diethylene glycol monomethyl ether | 20 wt % | |
|   | N-hdroxymethylaminoethanol | 5 wt % | |
|   | sorbitol | 5 wt % | |
|   | water | 30 wt % | |
| 12 | N-hydroxyformamide | 5 wt % | A |
|   | N-methylethanolamine | 15 wt % | |
|   | N-methylpyrrolidone | 70 wt % | |
|   | water | 10 wt % | |
| 13 | N-hydroxyformamide | 5 wt % | A |
|   | N-methylethanolamine | 15 wt % | |
|   | N-hdroxymethylaminoethanol | 5 wt % | |
|   | N-methylpyrrolidone | 65 wt % | |
|   | water | 10 wt % | |
| 14 | N-hydroxyformamide | 15 wt % | A |
|   | isopropanolamine | 30 wt % | |
|   | N-hydroxymethylamino-2-propanol | 1 wt % | |
|   | diethylene glycol monobutyl ether | 34 wt % | |
|   | water | 20 wt % | |
| 15 | N-hydroxyformamide | 5 wt % | B |
|   | N,N'-di(hydroxymethyl)ethylenediamine | 0.5 wt % | |
|   | propylene glycol | 94.5 wt % | |
| 16 | N-hydroxyformamide | 5 wt % | A |
|   | aminoethoxyethanol | 60 wt % | |
|   | dimethyl sulfoxide | 30 wt % | |
|   | water | 4.9 wt % | |
|   | Anti-tox EHD400* | 0.1 wt % | |
| Comparative Examples | | | |
| 5 | ethanolamine | 35 wt % | C |
|   | diethylene glycol monomethyl ether | 30 wt % | |
|   | sorbitol | 5 wt % | |
|   | water | 30 wt % | |
| 6 | N-methylpyrrolidone | 90 wt % | D |
|   | water | 10 wt % | |

*Phosphoric ester surfactant available from Dai-Ichi Kogyo Seiyaku Co., Ltd.

EXAMPLES 17–20 AND COMPARATIVE EXAMPLES 7–8

In these examples and comparative examples, the production of a thin film transistor was simulated. On a glass substrate, two low-temperature polysilicon layers (about 300 Å thick) having an intervening $SiO_2$ layer were formed. Further disposed thereon was an insulating layer on which resists remained. The insulating layer was partly removed to cause a part of the polysilicon layers to be exposed to direct contact with the cleaning composition for resist stripping. The substrate was immersed at 40° C. for 15 min in each cleaning composition shown in Table 4, rinsed with water, dried by blowing nitrogen gas, and the observed under an optical microscope to evaluate the resist removal and the corrosion of the polysilicon layer. The results are shown in Table 4.

TABLE 4

| | Compositions | | Resist Removal | Corrosion |
|---|---|---|---|---|
| Examples | | | | |
| 17 | ethanolamine | 5 wt % | removed | none |
|   | N-methylpyrrolidone | 74.9 wt % | | |
|   | polyethyleneimine (MW = 10000) | 0.1 wt % | | |
|   | N-hydroxyformamide | 1 wt % | | |
|   | water | 20 wt % | | |
| 18 | isopropanolamine | 3 wt % | removed | none |
|   | dimethylacetamide | 60 wt % | | |
|   | polyallylamine (MW = 3000) | 0.01 wt % | | |
|   | N-hydroxyformamide | 1 wt % | | |
|   | water | 34.99 wt % | | |
|   | N-hdroxymethylamino-2-propanol | 1 wt % | | |
| 19 | aminoethylaminoethanol | 30 wt % | removed | none |
|   | N-hydroxyformamide | 1 wt % | | |
|   | dipropylene glycol monomethyl ether | 69 wt % | | |
| 20 | dimethylaminoethanol | 94 wt % | removed | none |
|   | N-hydroxyformamide | 1 wt % | | |
|   | methylolurea | 2 wt % | | |
|   | water | 3 wt % | | |

TABLE 4-continued

| | Compositions | | Resist Removal | Corrosion |
|---|---|---|---|---|
| Comparative Examples | | | | |
| 7 | N-methylpyrrolidone | 75 wt % | removed | corroded |
| | water | 20 wt % | | |
| | ethanolamine | 5 wt % | | |
| 8 | isopropanolamine | 3 wt % | not removed | corroded |
| | dimethylacetamide | 62 wt % | | |
| | water | 35 wt % | | |

The cleaning composition of the present invention removes resists in a short period of time without causing the corrosion of wiring materials.

What is claimed is:

1. A cleaning composition, adapted for removing photoresists from a substrate, comprising 0.001 to 60% by weight of N-hydroxyformamide represented by the following formula (2):

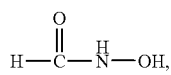
(2)

0 to 99.999% by weight of an alkaline compound, and
0 to 95% by weight of an organic solvent, and
at least one amine polymer selected from the group consisting of polyallylamines, polyethyleneimines, and polyvinylamines, wherein said at least one amine polymer has an average molecular weight of 250 or more.

2. The cleaning composition according to claim 1, which includes the alkaline compound, in an amount up to 99.999% by weight.

3. The cleaning composition according to claim 2, wherein the alkaline compound is free from metallic element.

4. The cleaning composition according to claim 2, wherein the alkaline compound is at least one compound selected from the group consisting of alkyl amines, alkanol amines, polyamines, hydroxyl amine compounds, cyclic amines, and quaternary ammonium salts.

5. The cleaning composition according to claim 1, which includes the organic solvent, in an amount up to 95% by weight.

6. The cleaning composition according to claim 1, further comprising a corrosion inhibitor.

7. The cleaning composition according to claim 1; further comprising a compound having a hydroxymethylamino structure represented by the following formula (1):

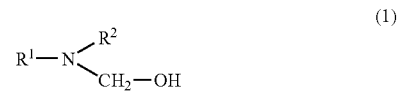
(1)

wherein $R^1$ and $R^2$ are each independently hydrogen or a substituent having 1 to 12 carbon atoms, $R^1$ and $R^2$ optionally being bonded to each other, to form together with nitrogen, a ring structure having 2 to 12 carbon atoms.

8. The cleaning composition according to claim 1, further comprising water.

9. The cleaning composition according to claim 1, consisting essentially of 0.001 to 60% by weight of the N-hydroxyformamide, 0 to 99.999% by weight of the alkaline compound, 0 to 95% by weight of the organic solvent and 0.0001 to 30% by weight of the at least one amine polymer.

10. The cleaning composition according to claim 1, which includes 0.01 to 80% by weight of the alkaline compound.

11. The cleaning composition according to claim 10, which includes 20 to 80% by weight of the organic solvent.

12. The cleaning composition according to claim 11, wherein said organic solvent is a water-soluble organic solvent.

13. The cleaning composition according to claim 11, which includes 3 to 40% by weight water.

14. A method for cleaning a substrate of semiconductor integrated circuits or liquid crystal display devices, the method comprising a step of bringing the substrate into contact with the cleaning composition as defined in claim 1.

* * * * *